United States Patent [19]

Hassan et al.

[11] 4,270,999

[45] Jun. 2, 1981

[54] METHOD AND APPARATUS FOR GAS FEED CONTROL IN A DRY ETCHING PROCESS

[75] Inventors: Javathu K. Hassan, Hopewell Junction; John A. Paivanas, Hyde Park, both of N.Y.

[73] Assignee: International Business Machines Corporation, Armonk, N.Y.

[21] Appl. No.: 79,759

[22] Filed: Sep. 28, 1979

[51] Int. Cl.³ .................. C23F 1/00; C23C 15/00
[52] U.S. Cl. .................. 204/192 E; 204/298; 156/345; 156/643
[58] Field of Search ............ 204/192 E, 192 R, 298; 156/345, 643

[56] References Cited

U.S. PATENT DOCUMENTS

| | | | |
|---|---|---|---|
| 3,976,555 | 8/1976 | Von Hartel | 204/192 |
| 4,033,287 | 7/1977 | Alexander, Jr. et al. | 204/298 X |

OTHER PUBLICATIONS

A. Galicki et al., Plasma Reaction Chamber, IBM Technical Disclosure Bulletin, vol. 20, No. 6, Nov. 1977, p. 2211.
H. M. Gartner et al., Selective Etch Rate Control Technique in Reactive Ion Etching, vol. 21, No. 3, IBM Tech. Disc. Bul., Aug. 1978, pp. 1032-1033.
H. M. Gartner et al., Reaction By-Products Collection Surface, IBM Tech. Disc. Bul., vol. 20, No. 8, Jan. 1978, p. 3106.
Encyclopedia Britannica, 15th edition, vol. 17: Sound, pp. 21, 22.

Primary Examiner—Delbert E. Gantz
Assistant Examiner—William Leader
Attorney, Agent, or Firm—James R. McBride

[57] ABSTRACT

A method and apparatus for obtaining a uniform gaseous molecular field under high vacuum conditions encountered in a dry etching process. In the method a source of a gas is provided and introduced into a manifold. The manifold feeds at least one nozzle and the gas is passed through the manifold and through the nozzle into a chamber maintained under vacuum conditions. The pressure of the gas and the configuration of the manifold and nozzle are such that the gas is caused to exit from the nozzle into the chamber under vacuum at sonic velocity.

13 Claims, 9 Drawing Figures

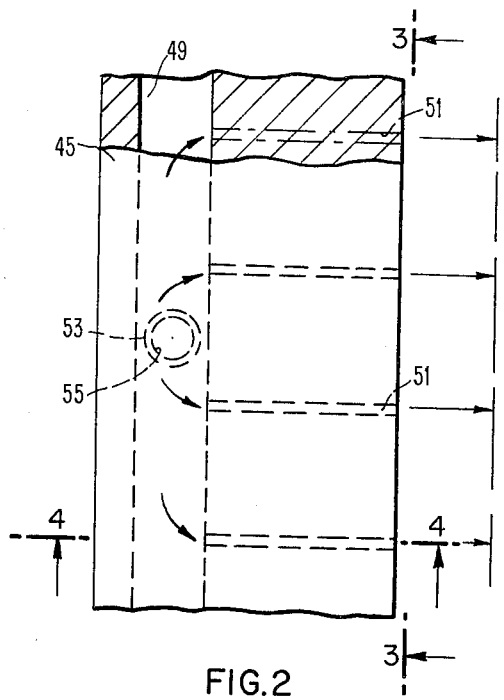
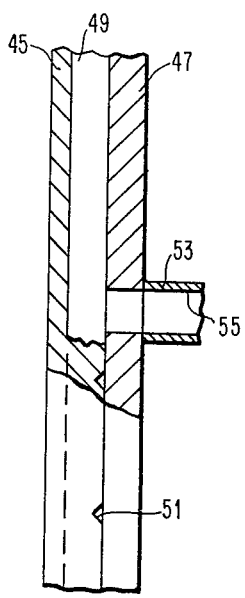
FIG. 2     FIG. 3
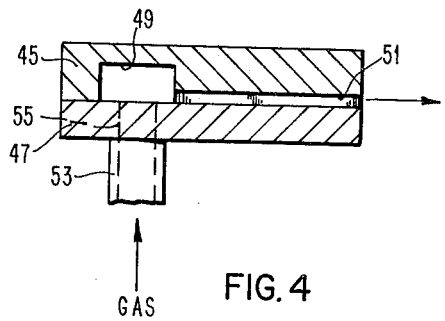
FIG. 4
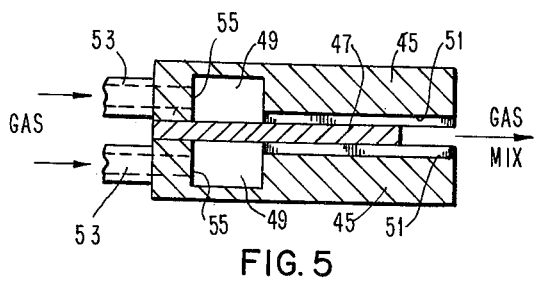
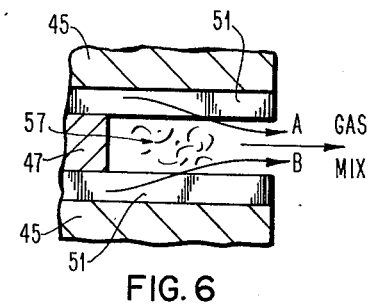
FIG. 5     FIG. 6

METHOD AND APPARATUS FOR GAS FEED CONTROL IN A DRY ETCHING PROCESS

BACKGROUND OF THE INVENTION

The present invention relates to a dry etching process and to an etching apparatus and more particularly relates to techniques for controlling etchant gas feed and control of the reactor flow during a dry etching process.

Plasma-type etching processes using, for example, tetrafluoromethane ($CF_4$) gas, have come to be widely used in place of solution-type etching in the production of semiconductor devices. Plasma-type etching utilizes a reactive gas in a radio frequency glow discharge to etch silicon and its compounds, such as silicon nitride and silicon oxide, and also molybdenum layers and tungsten layers. Plasma-type etching and reactive ion etching have sometimes been referred to as dry etching or dry process technology. The basic aim in dry process technology is to provide most favorable conditions of etching rate, uniformity of etching, selectivity and etch definition. Prior art dry etching processes were sometimes defective in that an uneven distribution of positive and negative ions in a high electric and magnetic field lead to irregular etching.

The general flow characteristics of the etchant gas in dry process technology, due to the high vacuum used in this technology, are in the domain of rarefied gas dynamics. Specifically, the gas flow occurs in the ranges of free-molecular flow and the transition flow regime which occurs between free-molecular flow and continuum flow. Thus, the flow behavior in the reactivity zone is characterized by predominately molecular collision phenomena. Continuum fluid mechanics are not useful to predict mass flow effects under the reactor conditions encountered in dry processing techniques.

In general, the present state of dry processing technology is such that etching performance variation occur under various operating conditions. The principal variation which affects etching performance is the character and uniformity of the gas field in the reactivity zone surrounding the etching object. The present invention is directed to new techniques and apparatus for generating and controlling uniform, highly effective gas field characteristics in a reactivity zone.

SUMMARY OF THE INVENTION

Heretofore, it has been believed in dry processing technology that the etchant gas attains a uniform flow distribution through natural transport phenomena caused by the flow characteristics set up by the outflow of gas occasioned by the high vacuum field used in the process. In accordance with the present invention it has been discovered that the flow pattern caused by the vacuum takeoff is highly non-uniform and that a significant improvement in etching uniformity can be achieved by introducing the etchant gas into the reactivity zone at sonic velocity.

In the method of the present invention for obtaining a uniform gaseous molecular field under high vacuum conditions a source of an etchant gas is provided at a relatively high pressure compared to the vacuum pressure in the reactivity zone. The high pressure gas source in introduced into a manifold which feeds at least one nozzle. The nozzle has a configuration such that passage of the gas from the relatively high pressure of the manifold to the vacuum pressure in the reactivity zone causes the gas to exit from the nozzle at sonic velocity. The sonic velocity attitude of the gas at the exit end of the nozzle causes the gas molecules to form a highly swirled flow pattern which achieves a highly uniform gas field in the reactivity zone adjacent the etching object.

BRIEF DESCRIPTION OF THE DRAWINGS

With reference to the drawings,

FIG. 2 is a top view of a nozzle assembly embodying features of the invention;

FIG. 3 is a side view, partially broken away, of FIG. 2;

FIG. 4 is a cross-sectional end view taken along line 4—4 of FIG. 3;

FIG. 5 is a cross sectional view of an alternate embodiment of a nozzle assembly showing a construction whereby two gas streams can be introduced into the etching apparatus of FIG. 1;

FIG. 6 is an enlarged fractional sectional view of the termination of the nozzle assembly of FIG. 5;

DETAILED DESCRIPTION OF THE INVENTION

Figure 1:
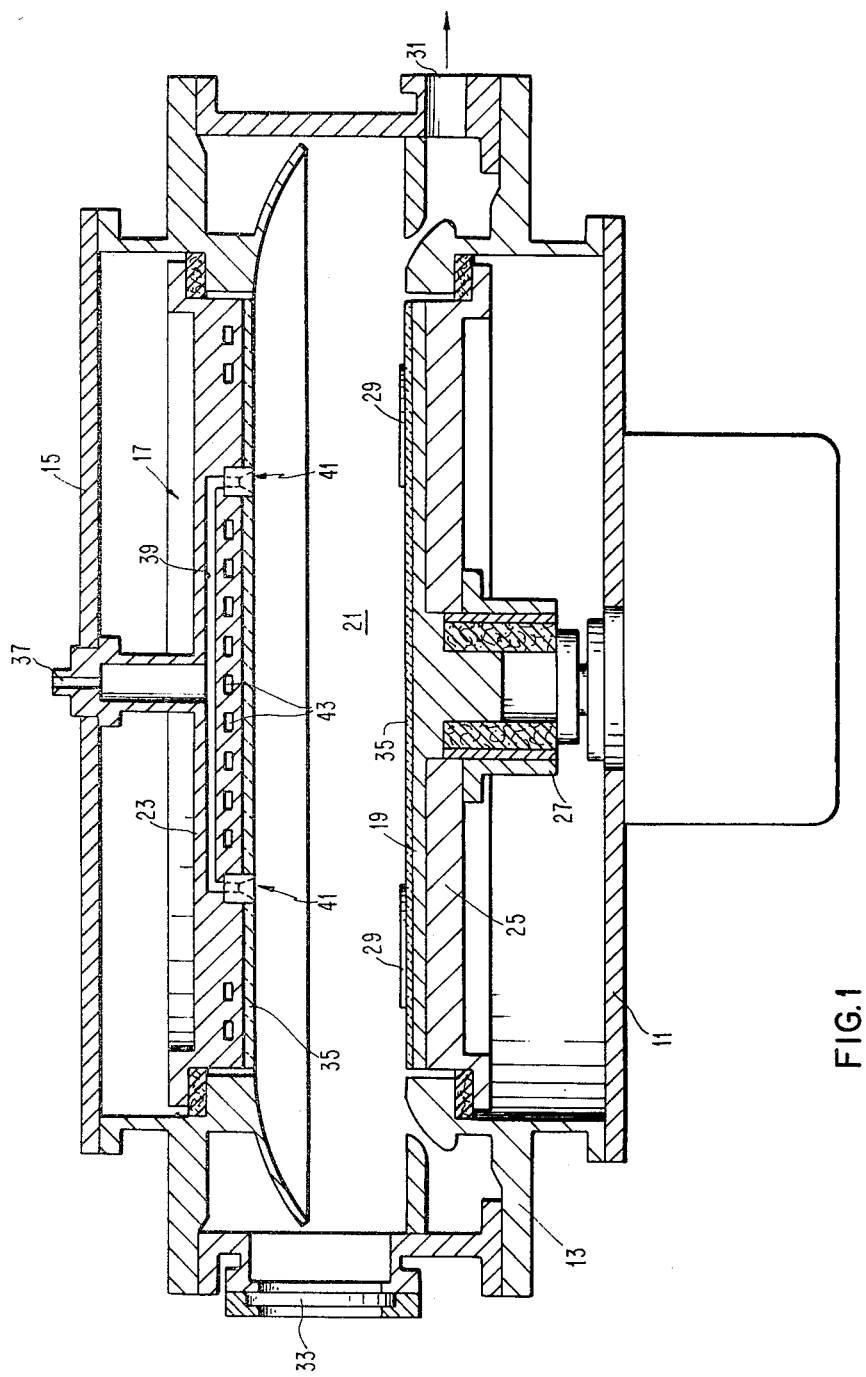
FIG. 1 is a cross-sectional view of an etching apparatus embodying the present invention.

Turning first to FIG. 1, there is shown apparatus for dry etching or for carrying out vapor or gaseous deposition on the exposed surfaces of a substrate 29, which may be wafers or slices of semiconductor material. The apparatus described herein can be used for other treatment of the substrates in addition to etching and deposition. For example, the apparatus can be used for sputtering processes whereby material is added to or removed from the exposed surfaces of the substrate.

The apparatus in FIG. 1 consists of a base plate 11, a sidewall 13 and a top plate 15. The base plate, sidewall and top plate are connected in sealing relationship to define an evacuable chamber. A gas manifold assembly 17 is located within the evacuable chamber. A rotatable carrier 19 is positioned beneath the gas manifold assembly 17. The space between the rotatable carrier 19 and the gas manifold assembly 17 defines a reaction zone 21. A first electrode 23 and a second electrode 25, which are both parallel cylindrical plate-like members, are contained within the reactor. The first electrode is electrically coupled to an RF power source (not shown) and the second electrode is electrically coupled to a reference potential which is typically ground potential. A drive mechanism 27 is provided to turn the rotatable carrier to position a substrate 29 in a desired location. A vacuum source (not shown) is coupled to port 31 to evacuate the reaction zone 21. A view port 33 is provided to observe the progress of the etching procedure during a run. The upper surface of the rotatable carrier and the lower surface of the gas manifold assembly are provided with a quartz liner 35 for protection against the etching atmosphere. When the RF source is activated and appropriate gases are introduced into the reaction zone, a glow discharge reaction occurs in the space between the two electrodes. The quartz liners 35 protect the surfaces of the first electrode and the rotatable carrier during the glow discharge reaction.

The gas manifold assembly 17 comprises a gas inlet port 37, a gas manifold 39 and nozzle assembly 41. A plurality of coolant passages 43 is provided to cool the gas manifold assembly 17 during the etching process.

The operating principles of the gas nozzle assembly 41 are best understood by reference to FIGS. 2-4. As shown in FIGS. 2-4 the gas nozzle assembly comprises a passage member 45 and a backing member 47. The passage member 45 is machined to provide a channel 49 and grooves 51. The grooves 51 intersect the channel 45 and and extend from the channel 45 to the peripheral edge of the passage member 45. The passage member 45 is then affixed to the backing member 47 by suitable means, such as bolts or screws (not shown). When assembled in fixed relationship, the channel 49 and intersecting grooves 51 define a manifold and an intersecting plurality of passages which act as nozzles. A gas feed port 53 is affixed to the second member 47 and interconnects with the channel 49 of the first member via a port 55 drilled through the second member 47.

As shown in FIG. 3, a preferred configuration for the grooves 51 is a triangular cross section. The triangular cross section is preferred for ease of manufacture. Other cross sectional shapes, such as semicircular, rectangular, square or polygonal are also suitable. It is also feasible to machine the surface of both the passage member and the backing member to provide circular, ovoid or rhomboid shapes. When both the passage member and backing member are machined, however, registration of the two members is required. For this reason, it is preferred to machine only the passage member.

In operation, etchant gas at a relatively low absolute pressure and a relatively high pressure compared to the vacuum chamber pressure is introduced into the manifold created by channel 49 and passes through the gas passages created by grooves 51. The pressure of the etchant gas is preferably from about 1 to about 10 psig. The gas passages are preferably in the range of from about 0.5 to about 1.0 inch long and preferably have a cross sectional area in the range of from about 2 to about $5 \times 10^{-6}$ in$^2$. The preferred ratio of the gas passage length to the cross sectional area is in the range of from about $0.1 \times 10^6$ to about $0.5 \times 10^6$ in$^{-1}$. The preferred dimension parameters of the gas passage provide a nozzle configuration such that sonic velocity of the etchant gas can be obtained at the relatively low absolute pressure of the etchant gas in the manifold.

Gas passage routes having the length, cross sectional area and length to cross sectional area ratio parameters as described herein provides an aggregate passage resistance to the flow of the gas such that the manifold pressure is essentially constant throughout the length of the manifold. The gas passage parameters described herein also provide an energy dissipation factor such that the passage of the gas through the passage results in attainment of sonic velocity upon exit of the gas from the nozzle. The attainment of sonic velocity promotes an explosive discharge from the vacuum terminus of the nozzle which engenders a highly swirled and uniform dissipation of gas molecules in the reaction zone.

As shown in FIG. 5 the gas nozzle construction of the present invention is adapted to provide for the influx of two or more gases and to promote mixing of the gases as they emerge into the evacuable chamber. In the nozzle construction of FIG. 5 two passage members 45 are machined with channels and grooves to provide the manifold and gas passages described hereinabove. The two passage members 45 are joined in metal to metal contact with a second member 47 to create the manifold and gas passages described heretofore.

As shown in FIG. 5 the backing member 47 terminates prior to the passage members 45. As shown in FIG. 6 this provides for a mixing section 57 wherein the two gas species are highly comingled and form a uniform gas mixture prior to emerging into the reaction zone 21. The spacing of the terminus of the backing member 47 from the terminus of the passage members 45 is not critical and, in fact, can be less than, equal to or greater than the terminus of the members 45. The emergence of the two gas species at sonic velocity creates a highly swirled relationship of the two gases regardless of the location of the terminus of the backing member 47.

Figure 7:
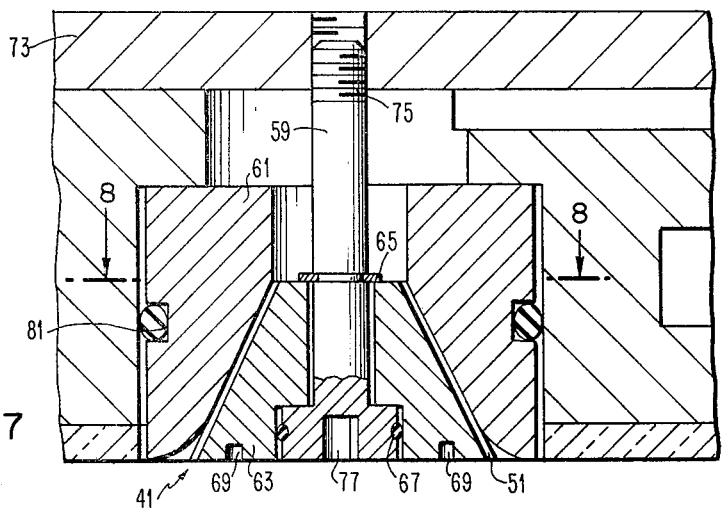
FIG. 7 is a cross-sectional view showing a further embodiment of nozzle assembly for facilitating insertion into the etching apparatus of FIG. 1.
Figure 8:
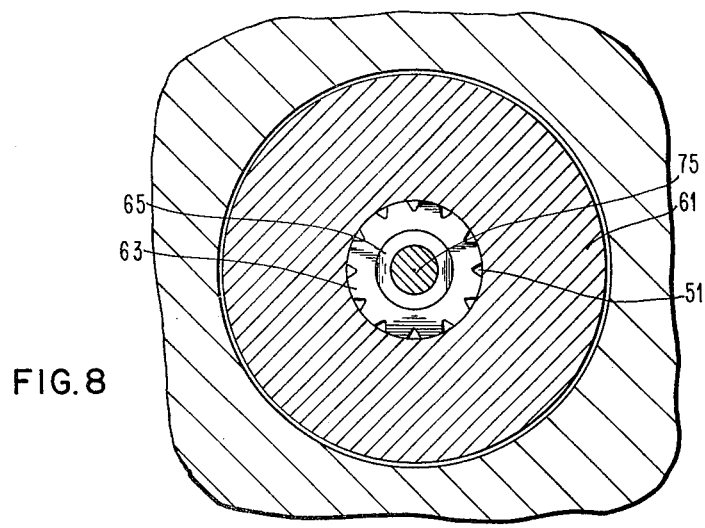
FIG. 8 is a top view of FIG. 7 taken along line 8—8 showing the configuration of the nozzle outlet.

A preferred embodiment of the gas nozzle assembly 41 is shown in FIG. 7. The nozzle assembly 41 of FIG. 7 can be considered to be a form of the nozzle assembly 41 of FIG. 2 wherein the flat plate of FIG. 2 is formed into a conical member. As shown in FIG. 7, the nozzle assembly comprises an attachment shaft 59, a nozzle body 61 and an insert 63. As best seen in FIG. 8, the insert 63 has triangular grooves 51 machined along the conical surface thereof. The grooves are used to form gas passages as described hereinabove in connection with the construction of FIGS. 2-4. A retaining ring 65 is used to hold the shaft 59 and the insert 63 in fixed axial relationship while permitting the insert 63 to be rotated about the shaft 59. Spanner holes 69 are provided to hold the insert as the shaft 59 is attached to a threaded socket 71 in top plate 73 by means of the threaded end 75 of the shaft. A hexagonal socket 77 is provided to accept an allen wrench for turning shaft 59 into engagement with top plate 73.

To assemble the gas nozzle assembly of FIG. 7, the shaft 59 is first inserted into the mating aperture 67 of the insert 63 and retaining ring 65 is attached. The insert is free to rotate on the shaft. The assembled insert 63 and shaft 59 are then mated with the nozzle body 61. The insert and shaft assembly are held in position by means of a spanner and the shaft is screwed into the top plate by means of an allen wrench. An O-ring 67 is provided to block passage of any gas between the mating surfaces of the shaft 59 and the insert 63.

When positioned in place the grooves of the insert 63 are adjacent the surface of a mating block 79 to provide a gas passage. O-ring 81 is provided to prevent any gas leakage between the surface shown.

Figure 9:
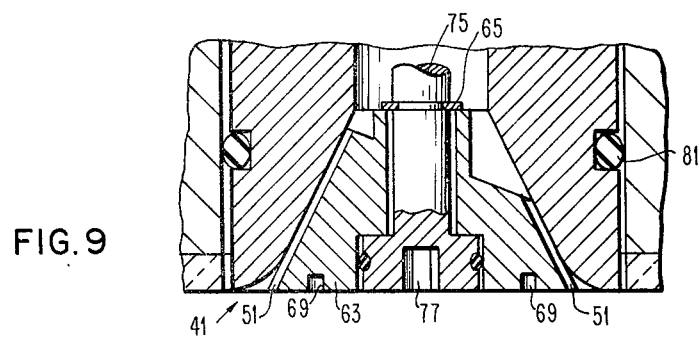
FIG. 9 is a cross-sectional view of a further embodiment of a nozzle insert whereby a variable passage length is provided.

The present invention can be used to provide variable passage lengths for specific gas flow characteristics. An insert with variable passage lengths is shown in FIG. 9. As shown in FIG. 9, the insert consists of an obliquely truncated cylinder having grooves machined in the surface of the cylinder. Because of the oblique truncation, the grooves have a variable length. When the obliquely truncated cylindrical insert 63 is inserted into mating contact with the nozzle body 61, the position of the variable passages 51 can be preset by holding the insert 63 in a desired position as the shaft 59 is screwed into position.

The various structural features defined herein with relationship to the different embodiments may be combined in a manner different than described herein and some modifications and variations may be made to these different embodiments without departing from the spirit and scope of the invention as set forth in the appended claims.

Having thus described our invention, what we claim as new, and desire to secure by Letters Patent is:

1. A method for dry etching in a uniform gaseous molecular field under high vacuum conditions comprising providing a source of a reactant gas, introducing said gas into a manifold, said manifold feeding at least one nozzle, passing said gas through said manifold and through said nozzle into a chamber maintained under vacuum conditions, causing said gas to exit from said nozzle into said chamber under vacuum at sonic velocity within said nozzle, creating plasma from said reactant gas adjacent said objects and etching said objects.

2. A method in accordance with claim 1 wherein said gas is provided to said manifold at a relatively high pressure compared to the pressure of said vacuum chamber.

3. A method in accordance with claim 1 wherein said gas is provided to said manifold at a pressure from about 1 to about 10 psig.

4. A method in accordance with claim 1 wherein said nozzle has a cross sectional area in the range of from about $2 \times 10^{-6}$ to about $5 \times 10^{-6}$ in$^2$.

5. A method in accordance with claim 1 wherein said nozzle has a length of from about 0.5 to about 1.0 in.

6. A method in accordance with claim 1 wherein the ratio of the nozzle length to the cross sectional area of the nozzle is in the range of from about $0.1 \times 10^6$ to about $0.5 \times 10^6$ in$^{-1}$.

7. In a plasma type etching apparatus including:
an evacuable chamber;
a support region within said chamber adapted to support at least one object to be etched,
means for generating a radio frequency discharge within said chamber adjacent the object to form a glow discharge plasma from reactant gases introduced into said chamber, and
vacuum means in communication with said chamber;
the improvement comprising gas-vapor feed means within said chamber, located adjacent said object so that gas vapor is introduced within said chamber adjacent said object, said gas feed means being adapted to receive a gas at high pressure and to introduce said gas into said chamber at the vacuum pressure of said chamber whereby said gas is at sonic velocity within said feed means prior to introduction into said chamber thereby creating a highly swirled gas field pattern in the region adjacent said object.

8. Plasma type etching apparatus in accordance with claim 7 wherein said gas-vapor feed means comprises a passage member having at least one groove and a backing member in mating relationship with said passage member to define a gas manifold in fluid communication with a gas nozzle.

9. Plasma type etching apparatus in accordance with claim 7 wherein said nozzle has a cross sectional area in the range of from about $2 \times 10^{-6}$ to about $5 \times 10^{-6}$ in$^2$.

10. Plasma type etching apparatus in accordance with claim 7 wherein said nozzle has a length of from about 0.5 to about 1.0 in.

11. A plasma type etching apparatus in accordance with claim 7 wherein the ratio of the nozzle length to the cross sectional area of the nozzle is in the range of from about $0.1 \times 10^6$ to about $0.5 \times 10^6$ in$^{-1}$.

12. A plasma type etching apparatus in accordance with claim 8 wherein said passage member is in the form of a truncated cone.

13. A plasma type etching apparatus in accordance with claim 8 wherein said passage member is in the form of an obliquely truncated cone.

* * * * *